(12) United States Patent
Cok et al.

(10) Patent No.: US 9,603,240 B2
(45) Date of Patent: *Mar. 21, 2017

(54) MAKING Z-FOLD MICRO-WIRE SUBSTRATE STRUCTURE

(71) Applicant: Eastman Kodak Company, Rochester, NY (US)

(72) Inventors: Ronald Steven Cok, Rochester, NY (US); Thomas Nathaniel Tombs, Rochester, NY (US)

(73) Assignee: EASTMAN KODAK COMPANY, Rochester, NY (US)

(*) Notice: Subject to any disclaimer, the term of this patent is extended or adjusted under 35 U.S.C. 154(b) by 292 days.

This patent is subject to a terminal disclaimer.

(21) Appl. No.: 14/289,896

(22) Filed: May 29, 2014

(65) Prior Publication Data

US 2015/0351220 A1  Dec. 3, 2015

(51) Int. Cl.

| H05K 1/18 | (2006.01) |
|---|---|
| H05K 1/02 | (2006.01) |
| H05K 3/22 | (2006.01) |
| H05K 3/10 | (2006.01) |
| H05K 3/12 | (2006.01) |

(Continued)

(52) U.S. Cl.
CPC ............ *H05K 1/028* (2013.01); *G06F 3/044* (2013.01); *H05K 1/0274* (2013.01); *H05K 1/189* (2013.01); *H05K 3/107* (2013.01); *H05K 3/1258* (2013.01); *H05K 3/22* (2013.01); *H05K 3/4635* (2013.01); *G06F 2203/04103* (2013.01); *H05K 2201/0108* (2013.01); *H05K 2201/055* (2013.01); *H05K 2201/056* (2013.01); *H05K 2201/10121* (2013.01); *H05K 2201/10128* (2013.01); *Y10T 29/4913* (2015.01); *Y10T 29/49156* (2015.01); *Y10T 29/49158* (2015.01); *Y10T 156/1015* (2015.01)

(58) Field of Classification Search
CPC ........ H01J 37/06; H01J 37/065; H01J 37/067; H01J 37/07; H01J 3/02; H01R 43/26; Y10T 29/49117

See application file for complete search history.

(56) References Cited

U.S. PATENT DOCUMENTS 5,520,112 A    5/1996  Schleinz et al.
6,501,528 B1 * 12/2002  Hamada ............ G02F 1/133305
                                                              345/4

(Continued)

FOREIGN PATENT DOCUMENTS

CN        102063951         7/2013

*Primary Examiner* — Minh Trinh
(74) *Attorney, Agent, or Firm* — Raymond L. Owens; Williams R. Zimmerli; Kevin E. Spaulding

(57) ABSTRACT

A method of making a folded micro-wire substrate structure includes providing a flexible substrate and first, second, and third portions. One or more electrical conductors are formed on or in the flexible substrate. The flexible substrate is folded with a first fold between the first and second portions so that the first portion is located adjacent to the second portion in a perpendicular direction. The flexible substrate is folded with at least a second fold between the second and third portions so that the second side is between the second portion and the third portion in the perpendicular direction. The folded flexible substrate is secured to form the folded micro-wire substrate structure.

16 Claims, 12 Drawing Sheets

(51) Int. Cl.
*H05K 3/46* (2006.01)
*G06F 3/044* (2006.01)

(56) References Cited

U.S. PATENT DOCUMENTS

| | | |
|---|---|---|
| 7,202,179 B2 | 4/2007 | Taussig et al. |
| 7,295,189 B2 * | 11/2007 | Ostergard ............... G06F 3/044 345/173 |
| 7,767,543 B2 * | 8/2010 | Tateishi .................... A61J 3/00 257/E21.002 |
| 7,792,558 B2 | 9/2010 | Bang et al. |
| 8,017,884 B2 | 9/2011 | Huang et al. |
| 8,179,381 B2 | 5/2012 | Frey et al. |
| 9,195,358 B1 * | 11/2015 | Cok ........................ G06F 3/044 |
| 2006/0055864 A1 | 3/2006 | Matsumura et al. |
| 2010/0026664 A1 | 2/2010 | Geaghan |
| 2010/0328248 A1 | 12/2010 | Mozdzyn |
| 2011/0007011 A1 | 1/2011 | Mozdzyn |
| 2015/0346876 A1 * | 12/2015 | Cok ........................ G06F 3/047 345/174 |

* cited by examiner

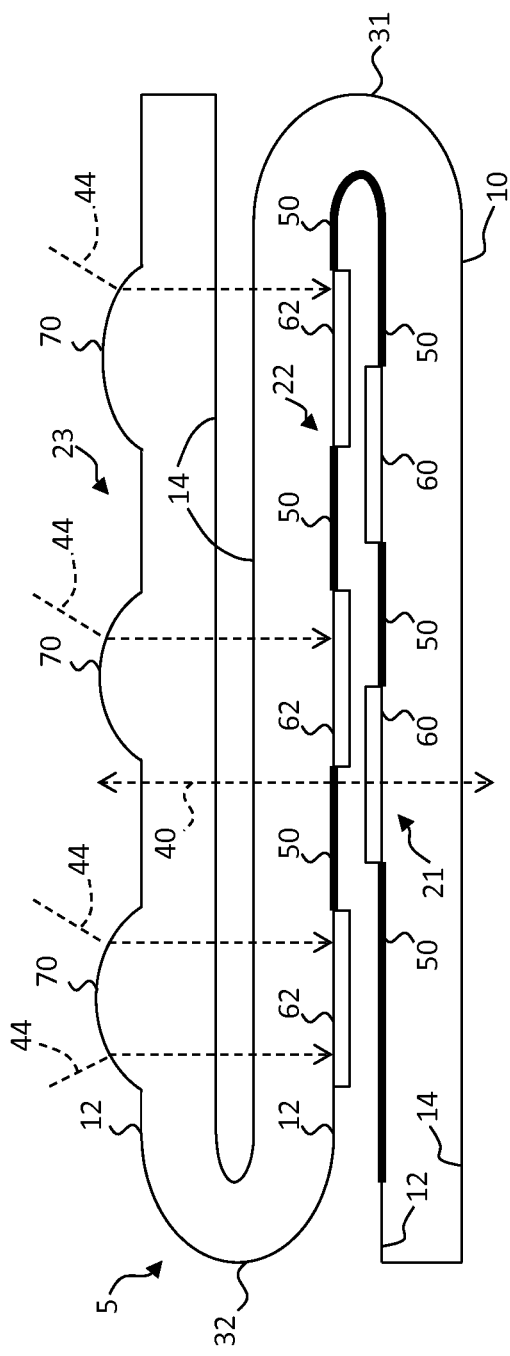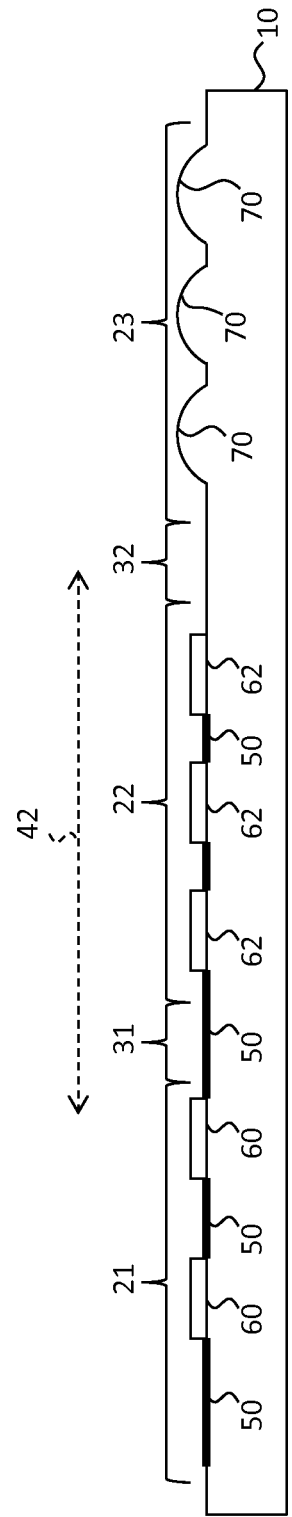

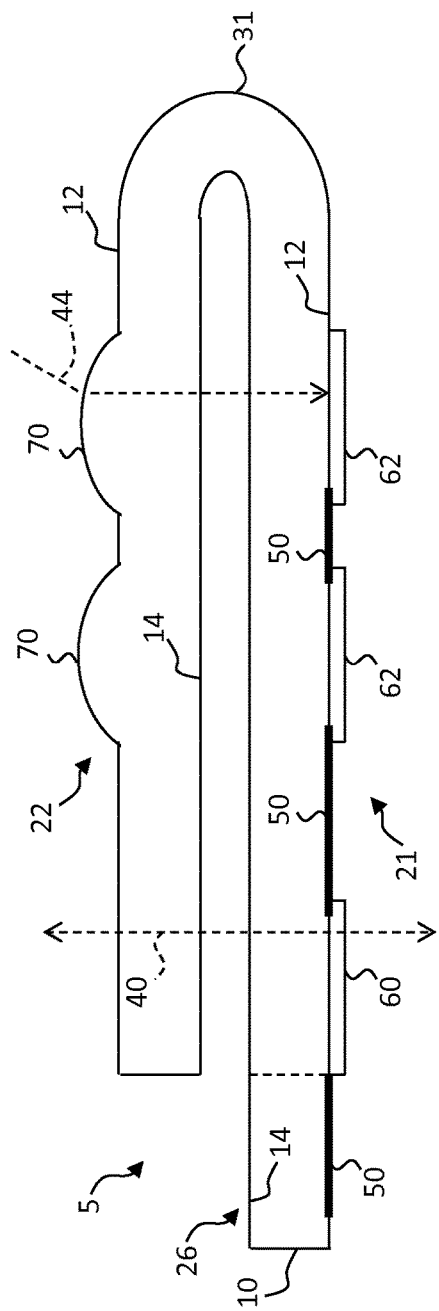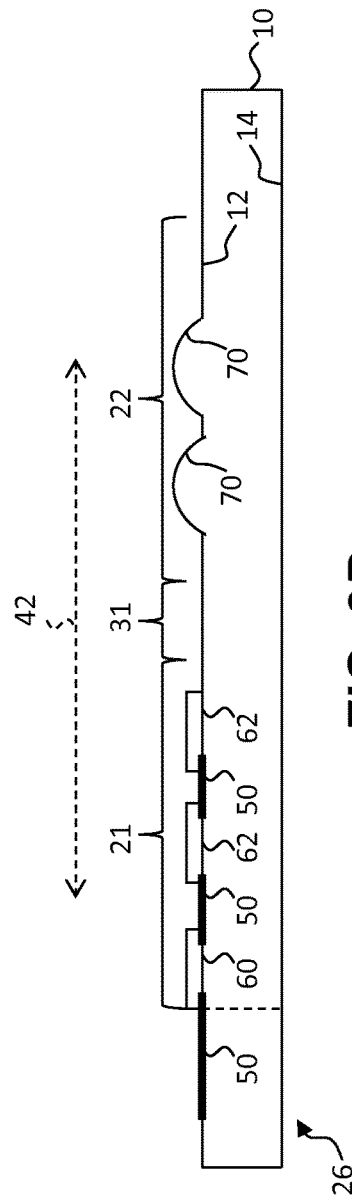

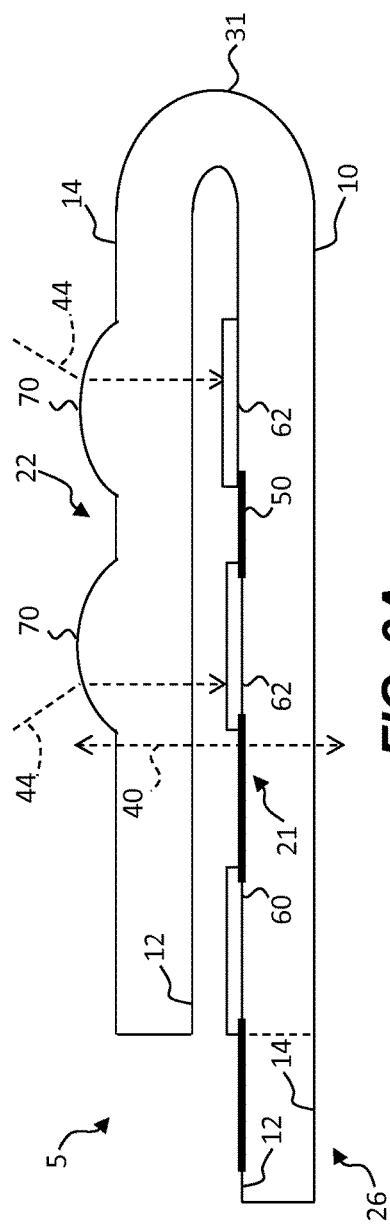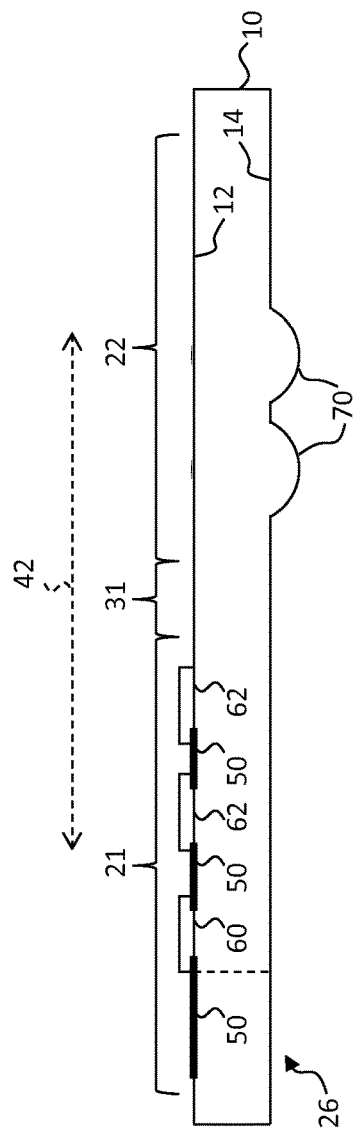
FIG. 3A
FIG. 3B

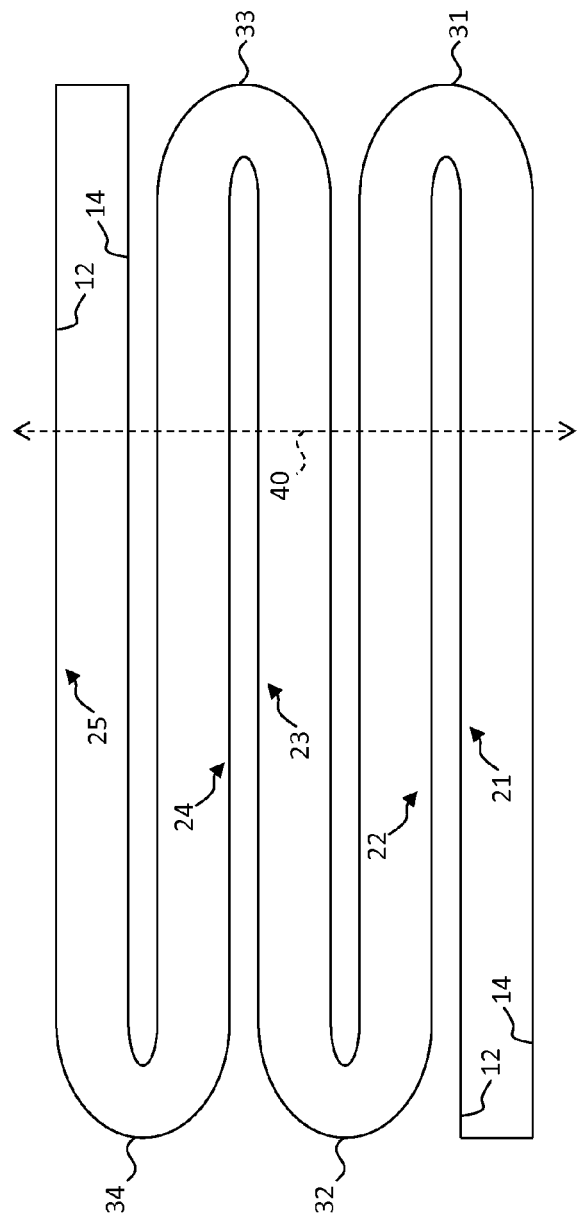
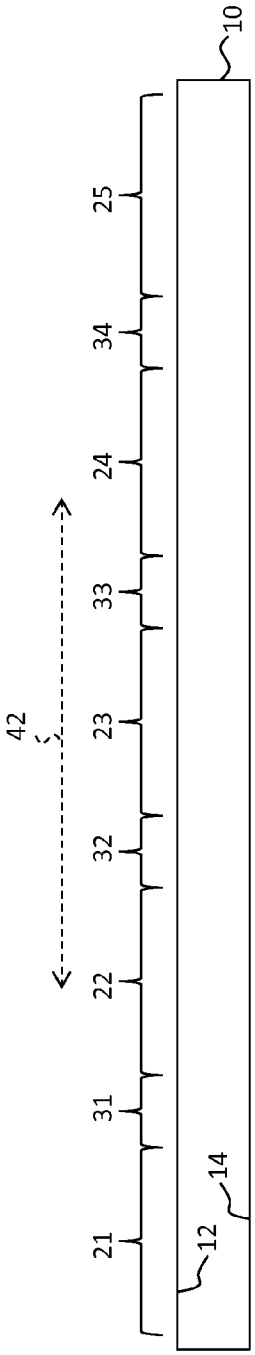
FIG. 5A
FIG. 5B

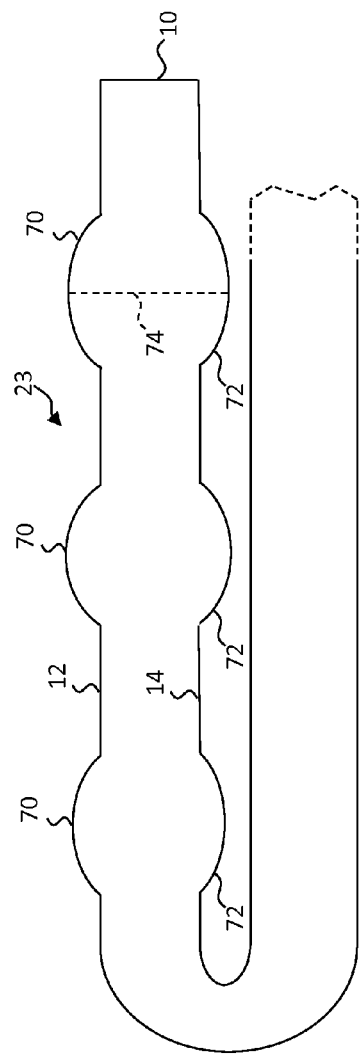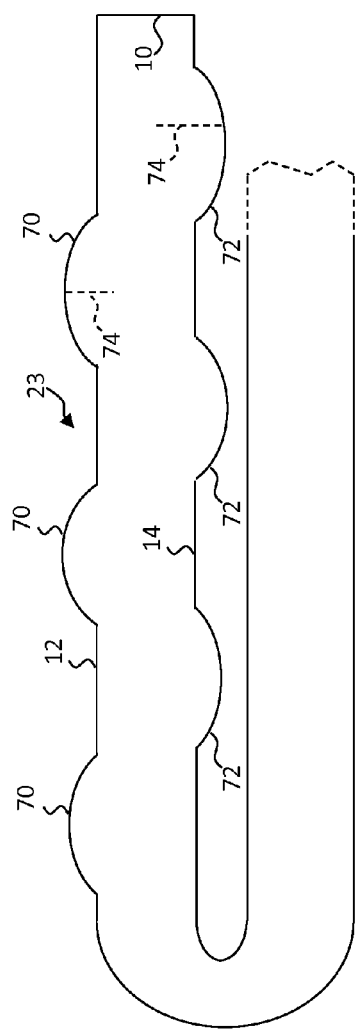
FIG. 6
FIG. 7

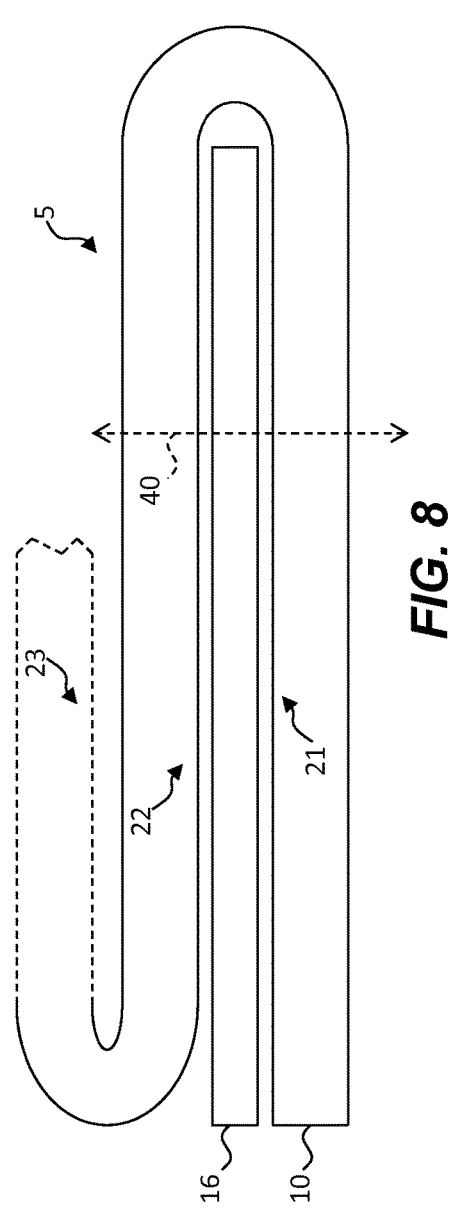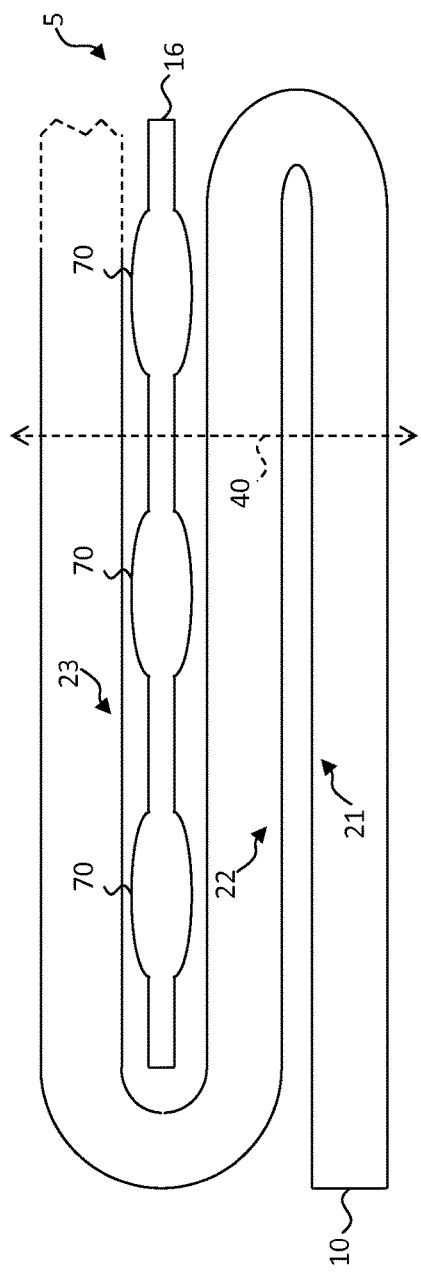
FIG. 8
FIG. 9

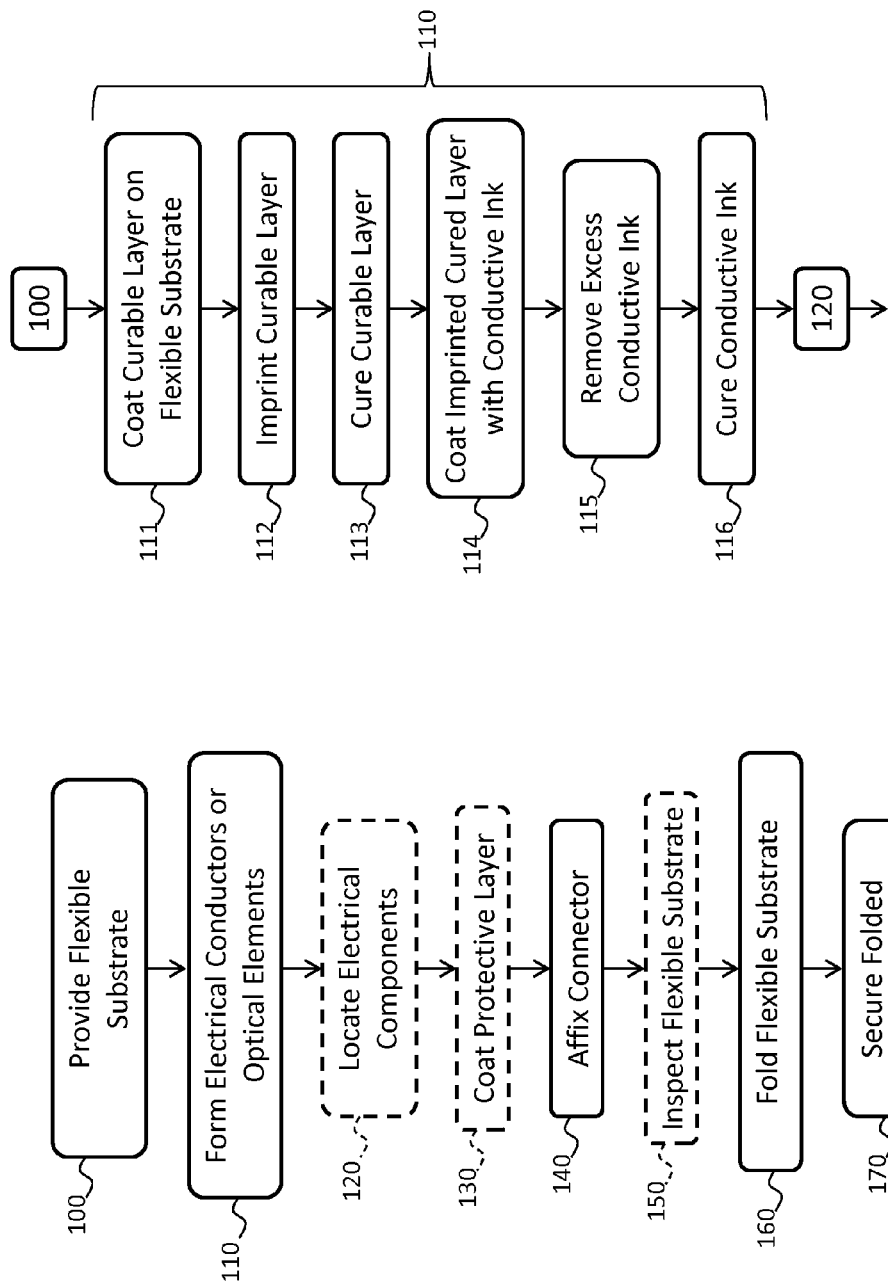

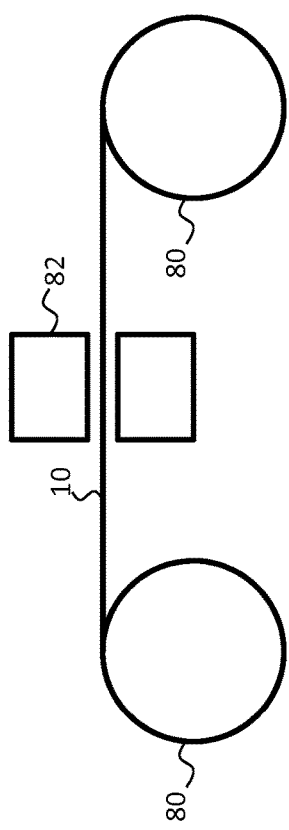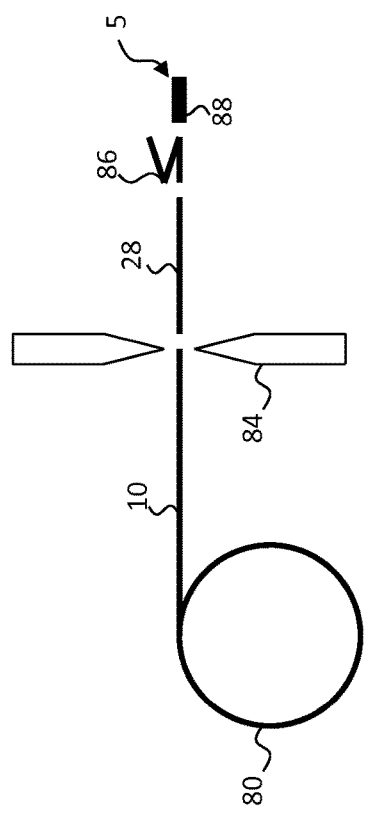
FIG. 13
FIG. 14

MAKING Z-FOLD MICRO-WIRE SUBSTRATE STRUCTURE

CROSS REFERENCE TO RELATED APPLICATIONS

Reference is made to commonly-assigned, U.S. patent application Ser. No. 14/253,939 (now U.S. Publication No. 2015/0305138), filed Apr. 16, 2014, entitled "Wrap-Around Micro-Wire Method" by Tombs et al, U.S. patent application Ser. No. 14/289,878 (now U.S. Publication No. 2015/0346876), filed May 29, 2014, entitled "Z-Fold Micro-Wire Substrate Structure" by Cok et al, to commonly-assigned, U.S. patent application Ser. No. 14/289,920 (now U.S. Pat. No. 9,195,358), filed May 29, 2014, entitled "Z-Fold Multi-Element Substrate Structure" by Cok et al, and to commonly-assigned, U.S. patent application Ser. No. 14/289,939 (now U.S. Publication No. 2015/0351232), filed May 29, 2014, entitled "Making Z-Fold Multi-Element Substrate Structure" by Cok et al, the disclosures of which are incorporated herein.

FIELD OF THE INVENTION

The present invention relates to electrically conductive micro-wires, circuits, and optical elements formed on a common flexible substrate in a folded configuration.

BACKGROUND OF THE INVENTION

Electronic devices formed on flexible substrates are used in applications that require non-planar forms or that require mechanical manipulation in different configurations. For example, some devices are designed to be folded or unfolded. Other devices are located on curved surfaces. A variety of technologies are under development for such applications, including organic electronics, inkjet deposition, polymer layers, and flexible substrate materials such as polymers and paper. Such technologies enable applications such as flexible or curved displays, antennas, solar cells, batteries, sensors, and biomedical devices.

Flexible substrates or printed circuit boards are an important component of flexible electronic devices. Currently, silk-screened metal wire conductors formed on a polymer substrate are used as flexible connectors in many electronic systems. Such methods typically have limited resolution. Other patterned conductors are formed using photolithographic processes on flexible materials, but such methods are typically difficult because of material and process compatibility issues and the expense of such processes. Such prior-art methods can also produce devices with a relatively limited radius of curvature, thereby limiting the applications and configurations to which the technology is applied.

There is also a need for high-density electronic devices that incorporate three-dimensional circuit structures. Such structures increase the number of computing elements per volume but are typically expensive to construct. Other applications integrate optical devices such as lenses or reflectors into optoelectronic devices. Such devices typically include multiple, separate elements that are separately manufactured and then carefully aligned and integrated at a relatively high resolution and cost.

Very fine patterns of conductive elements, such as metal wires or conductive traces are known. For example, U.S. Patent Application Publication No. 2011/0007011 teaches a capacitive touch screen with a mesh electrode, as do U.S. Patent Application Publication No. 2010/0026664, U.S. Patent Application Publication No. 2010/0328248, and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. In particular, micro-replication is used to form micro-conductors formed in micro-replicated channels. The transparent micro-wire electrodes include micro-wires between 0.5 g and 4 g wide and a transparency of between approximately 86% and 96%.

Conductive micro-wires can be formed in micro-channels embossed in a substrate, for example as taught in CN102063951, which is hereby incorporated by reference in its entirety. As discussed in CN102063951, a pattern of micro-channels is formed in a substrate using an embossing technique. Embossing methods are generally known in the prior art and typically include coating a curable liquid, such as a polymer, onto a rigid substrate. A pattern of micro-channels is imprinted (impressed or embossed) onto the polymer layer by a master having an inverted pattern of structures formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating or exposure to HCl vapor. In an alternative method described in CN102063951, a photosensitive layer, chemical plating, or sputtering is used to pattern conductors, for example, using patterned radiation exposure or physical masks. Unwanted material (e.g. photosensitive resist) is removed, followed by electro-deposition of metallic ions in a bath.

Multi-level masks are used with photo-lithography to form thin-film devices, for example as disclosed in U.S. Pat. No. 7,202,179. An imprinted 3D template structure is provided over multiple thin films formed on a substrate. The multiple levels of the template structure are used as masks for etching the thin films. This approach requires the use of a mask and multiple photo-lithographic steps.

The use of integrated circuits with electrical circuitry is well known. Various methods for providing integrated circuits on a substrate and electrically connecting them are also known. Integrated circuits can have a variety of sizes and packages. In one technique, Matsumura et al., in U.S. Patent Application Publication No. 2006/0055864, describes crystalline silicon substrates used for driving LCD displays. The application describes a method for selectively transferring and affixing pixel-control devices made from first semiconductor substrates onto a second planar display substrate. Wiring interconnections within the pixel-control device and connections from buses and control electrodes to the pixel-control device are shown.

Printed circuit boards are well known for electrically interconnecting integrated circuits and often include multiple layers of conductors with vias for electrically connecting conductors in different layers. Circuit boards are often made by etching conductive layers deposited on laminated fiberglass substrates. However, such etching processes are expensive and the substrates are not transparent and therefore of limited use in applications for which transparency is important, for example display and touch-screen applications.

Flexible substrates are also known in the art and are used with other devices, such as displays. U.S. Pat. No. 6,501,528 discloses a stacked display device with a folded substrate.

U.S. Pat. No. 7,792,558 describes a mobile communication device with bent connector wires and U.S. Pat. No. 8,017, 884 illustrates an integrated touch panel and electronic device. U.S. Pat. No. 5,520,112 describes a folded substrate and a dual-sided printing process. Such substrates, structures, and methods demonstrate an on-going need in the industry for manufacturing methods incorporating devices and flexible substrates.

SUMMARY OF THE INVENTION

There is a need, therefore, for further improvements in flexible optoelectronic devices that enable simplified manufacturing processes and fewer parts and processing steps at a lower cost.

In accordance with the present invention, a method of making a folded micro-wire substrate structure comprises:

providing a flexible substrate having a first side and a second side opposed to the first side, the flexible substrate having a first portion, a second portion adjacent to the first portion, and a third portion adjacent to the second portion so that the second portion is located between the first and third portions of the flexible substrate;

forming one or more electrical conductors on or in the flexible substrate;

folding the flexible substrate with a first fold between the first and second portions so that the first portion is located adjacent to the second portion in a direction perpendicular to the first, second, and third portions of the flexible substrate;

folding the flexible substrate having at least a second fold between the second and third portions so that the second side is between the second portion and the third portion in the perpendicular direction; and securing the folded flexible substrate to form the folded micro-wire substrate structure.

The present invention provides micro-wire structures in flexible configurations having improved electrical connectivity, processing capability, optical attributes and capabilities, and manufacturability. The micro-wire structures of the present invention are particularly useful in display devices or systems or photovoltaic devices or systems. The integration of active electronic devices, electrical conductors, and optical elements on a single flexible substrate reduces the number of parts, for example fewer electrical connectors are needed and permits fewer manufacturing steps, thereby reducing costs.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIG. 1A is a cross section of an embodiment of the present invention in a folded configuration;

FIG. 1B is a cross section of an embodiment of the present invention corresponding to FIG. 1A in a flat, unfolded configuration;

FIG. 2A is a cross section of an embodiment of the present invention in a folded configuration;

FIG. 2B is a cross section of an embodiment of the present invention corresponding to FIG. 2A in a flat, unfolded configuration;

FIG. 3A is a cross section of an embodiment of the present invention in a folded configuration;

FIG. 3B is a cross section of an embodiment of the present invention corresponding to FIG. 3A in a flat, unfolded configuration;

FIG. 5A is a cross section of an embodiment of the present invention in a folded configuration;

FIG. 5B is a cross section of an embodiment of the present invention corresponding to FIG. 5A in a flat, unfolded configuration;

FIGS. 6-10 are partial cross sections of embodiments of the present invention;

FIGS. 11-12 are flow diagrams illustrating various methods of the present invention;

FIGS. 13-14 are schematics illustrating various methods of the present invention.

The Figures are not drawn to scale since the variation in size of various elements in the Figures is too great to permit depiction to scale.

DETAILED DESCRIPTION OF THE INVENTION

The present invention is directed toward a folded micro-wire circuit structure that can incorporate aligned optical, conductive, and processing elements. The present invention is usefully constructed with a single substrate and methods of the present invention can form electrical and optical structures in common steps with common tools to reduce construction costs.

Figure 1C:
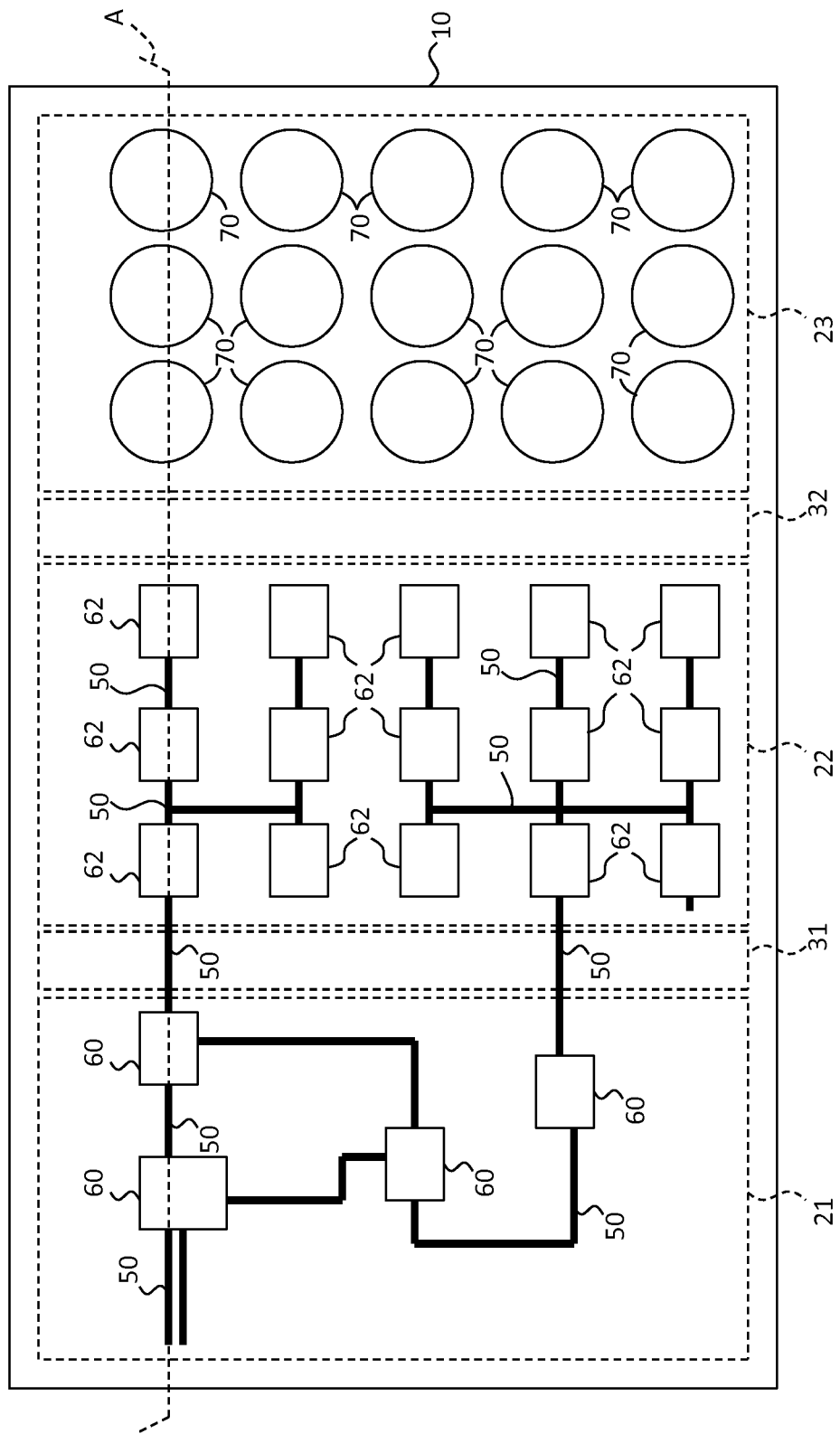
FIG. 1C is a plan view of an embodiment of the present invention in a flat, unfolded configuration having a cross section line corresponding to the embodiments of FIGS. 1A and 1B.

FIG. 1A illustrates a folded embodiment of the present invention, FIG. 1B illustrates a flat, unfolded embodiment of the present invention, and FIG. 1C is a plan view of a flat, unfolded embodiment of the present invention. The cross sections of FIGS. 1A and 1B are taken across cross section line A of FIG. 1C. Referring to FIGS. 1A, 1B, and 1C, in an embodiment of the present invention, a folded micro-wire substrate structure 5 includes a folded flexible substrate 10 having a first side 12 and a second side 14 opposed to the first side 12 in a direction 40 perpendicular to the first side 12. The flexible substrate 10 has a first portion 21, a second portion 22 adjacent to the first portion 21, and a third portion 23 adjacent to the second portion 22 so that the second portion 22 is between the first portion 21 and the third portion 23 of the flexible substrate 10 in a substrate direction 42 of the flexible substrate 10 when the flexible substrate 10 is in a flat, unfolded configuration (FIG. 1B). The perpendicular direction 40 is also perpendicular to the first, second, and third portions 21, 22, 23 in the flat, unfolded configuration (FIG. 1B).

In a folded configuration (FIG. 1A), the substrate direction 42 is along the surface of the flexible substrate 10. In the folded configuration of FIG. 1A, the flexible substrate 10 has at least a first fold 31 between the first and second portions 21, 22 so that the first portion 21 is also adjacent to the second portion 22 in the perpendicular direction 40. The flexible substrate 10 has at least a second fold 32 between the second and third portions 22, 23 so that the second side 14 is also between the second and third portions 22, 23 in the perpendicular direction 40. One or more electrical conductors 50 are located in or on the flexible substrate 10.

In various embodiments, the flexible substrate 10 is or includes a polymer material or layers including polymers. The electrical conductors 50 are metal, are formed from sintered or agglomerated metal particles, are located on the surface of the flexible substrate 10, or are located in microchannels formed in the surface of the flexible substrate 10 and extending into the flexible substrate 10. Such materials are known in the art. In a useful embodiment, the electrical conductors 50 are micro-wires and the electrical conductors 50 are considered to be micro-wires and are also referred to as micro-wire herein.

In the folded configuration of FIG. 1A, the first and second folds 31, 32 fold the flexible substrate 10 into a stacked or folded configuration. In the flat configuration of FIGS. 1B and 1C, the first, second, and third portions 21, 22, 23 are located substantially in a plane. In this configuration, the first fold 31 separates the first and second portions 21, 22 in a direction parallel to the substrate direction 42 or along the flexible substrate 10 and the second fold 32 separates the second and third portions 22, 23 in a direction parallel to the substrate direction 42 or along the flexible substrate 10. In the flat configuration, the first and second folds 31, 32 are not folded and are also referred to herein as the first and second fold gaps 31, 32 since they separate the different portions of the flexible substrate 10 substantially in a plane.

As used herein, portions are adjacent when two portions do not have another portion between them. Two portions can be adjacent in the substrate direction 42 or along the flexible substrate 10, for example when the flexible substrate 10 is in a flat configuration. Two portions can be adjacent in the perpendicular direction 40 when there is no other portion between them when the flexible substrate 10 is in the folded configuration. Thus, in FIG. 1A, the first portion 21 is adjacent to the second portion 22 and the second portion 22 is adjacent to the third portion 23 in the perpendicular direction 40. The first portion 21 is not adjacent to the third portion 23 in the perpendicular direction 40 because the second portion 22 is between the first and third portions 21, 23 in the perpendicular direction 40. Similarly, in FIGS. 1B and 1C, the first portion 21 is adjacent to the second portion 22 and the second portion 22 is adjacent to the third portion 23 in the substrate direction 42. The first portion 21 is not adjacent to the third portion 23 in the substrate direction 42 because the second portion 22 is between the first and third portions 21, 23 in the substrate direction 42. In the folded configuration of FIG. 1A, the first portion 21 is adjacent to the second portion 22 in both the perpendicular direction 40 and along the surface or first side 12 of the flexible substrate 10. Similarly, the second portion 22 is adjacent to the third portion 23 in both the perpendicular direction 40 and along the surface or first side 12 of the flexible substrate 10.

In a further embodiment of the present invention, the folded micro-wire substrate structure 5 further includes at least one electrical component 60 on or in the flexible substrate 10 in the first, second, or third portion 21, 22, 23. In an embodiment, the electrical component 60 is an active component, such as an organic transistor or an inorganic transistor. The electrical component 60 can use the same substrate as the flexible substrate 10 or have a substrate different from the flexible substrate 10, for example the electrical component 60 is an integrated circuit having an inflexible semiconductor substrate such as silicon completely different from but affixed to the flexible substrate 10. Alternatively, the electrical component 60 is an integrated circuit formed directly on or in the flexible substrate 10.

In various embodiments, the electrical component 60 forms an electrical circuit, is a part of an electrical circuit, or multiple electrical components 60 are electrically connected with electrical conductors 50 to form a circuit. In an arrangement, the electrical components 60 are located on both the first and second portions 21, 22. The electrical components 60 can process information, receive or transmit signals, or form a power circuit. In an embodiment, the electrical components 60 are light-interactive electrical components 62 that absorb light or other electro-magnetic radiation to produce electrical power, such as current, for example in a photo-voltaic system. Alternatively, the electrical components 60 are light-interactive electrical components 62 that emit light or other electro-magnetic radiation in response to electrical power, current, or voltage, for example in a display system. In a useful arrangement, the light-interactive electrical components 62 are located in the second portion 22 and the electrical components 60 are located in the first portion 21. The light-interactive electrical components 62 in the second portion 22 are electrically connected to the electrical components 60 in the first portion 21 with electrical conductors 50 that extend from the first portion 21, through the first fold 31, into the second portion 22. Thus, in an embodiment, at least one electrical conductor 50 extends from the first portion 21 to the second portion 22 and across the first fold 31, at least one electrical conductor 50 extends from the second portion 22 to the third portion 23 and across the second fold 32, or at least one electrical conductor 50 extends from the first portion 21 to the third portion 23 and across the first and second folds 31, 32 (not shown).

In another embodiment of the folded micro-wire substrate structure 5, the flexible substrate 10 is at least partially transparent and further includes one or more optical elements 70 on or in the flexible substrate 10 in the first, second, or third portions 21, 22, 23. In various embodiments, the optical elements 70 serve to redirect light 44, for example with refraction or reflection. In a useful embodiment, the optical elements 70 are lenses, for example convex or concave lenses.

In a useful embodiment, the first and second folds 31, 32, the optical elements 70, and the electrical components 60 or light-interactive electrical components 62 are aligned on the flexible substrate 10 so that at least one electrical component 60 or light-interactive electrical component 62 on or in the flexible substrate 10 in the first, second, or third portions 21, 22, or 23 is located so that light 44 is directed through the optical elements 70 to or from the electrical components 60 or light-interactive electrical components 62. In a useful arrangement, the electrical component 60 is located in the first portion 21, the light-interactive electrical component 62 is located in the second portion 22, and the optical element 70 is in the third portion 23 and the light travels through the flexible substrate 10. In various embodiments, the optical element 70 is formed in the flexible substrate 10 or secured to the flexible substrate 10, for example mechanically or with an adhesive. The flexible substrate 10 is substantially transparent, for example more than 50%, more than 70%, more than 80%, more than 90%, or more than 95% transparent to visible light or other electro-magnetic radiation.

In an alternative embodiment of the present invention, the folded micro-wire substrate structure 5 includes the folded flexible substrate 10 having the first side 12 and the second side 14 opposed to the first side 12 in the direction 40 perpendicular to the first side 12. The flexible substrate 10 has the first portion 21, the second portion 22 adjacent to the first portion 21, and the third portion 23 adjacent to the second portion 22 so that the second portion 22 is between the first and third portions 21, 23 of the flexible substrate 10 in the substrate direction 42 in a flat configuration. The first portion 21 is separated from the second portion 22 by the first fold gap 31 and the second portion 22 is separated from the third portion 23 by the second fold gap 32 along the flexible substrate 10. One or more electrical conductors 50 are located in or on the flexible substrate 10 and extend from the first portion 21 into the second portion 22 across the first fold gap 31. The third portion 23 includes at least one optical element 70 on or in the flexible substrate 10. In a further embodiment, the folded micro-wire substrate structure 5 includes one or more electrical components 60 electrically connected to the one or more electrical conductors 50 in the first or second portions 21, 22.

Referring next to FIGS. 2A and 2B, in another embodiment of the present invention, the folded micro-wire substrate structure 5 includes the flexible substrate 10 having the first side 12 and the second side 14 opposed to the first side 12 in the direction 40 perpendicular to the first side 12. The flexible substrate 10 has the first portion 21 and the second portion 22 adjacent to the first portion 21 of the flexible substrate 10 in the substrate direction 42 when the flexible substrate 10 is in a flat, unfolded configuration (FIG. 2B). The flexible substrate 10 has at least the first fold 31 between the first and second portions 21, 22 so that the first portion 21 is aligned and adjacent with the second portion 22 in the perpendicular direction 40 (FIG. 2A). One or more electrical conductors 50 are located in or on the flexible substrate 10. At least one electrical component 60 or light-interactive electrical component 62 is located on or in the flexible substrate 10 in the first portion 21. At least one optical element 70 is located on or in the flexible substrate 10 in the second portion 22 so that the optical element 70 directs light 44 to or from the electrical component 60 or the light-interactive electrical component 62. In an embodiment an extended portion 26 of the flexible substrate 10 adjacent to the first portion 21 extends beyond the second portion 22 in the substrate direction 42 in the folded configuration.

In a further embodiment, the folded micro-wire substrate structure 5 includes the flexible substrate 10 having the first side 12 and the second side 14 opposed to the first side 12 in the direction 40 perpendicular to the first side 12. The flexible substrate 10 has the first portion 21 and the second portion 22 adjacent to the first portion 21 of the flexible substrate 10. The flexible substrate 10 has at least the first fold gap 31 between the first and second portions 21 22. One or more electrical conductors 50 is located in or on the flexible substrate 10 in the first portion 21 and at least one optical element 70 is located on or in the flexible substrate 10 in the second portion 22. In a further embodiment, the folded micro-wire substrate structure 5 further includes at least one electrical component 60 or light-interactive electrical component 62 on or in the flexible substrate 10 in the first portion 21 electrically connected to one or more of the electrical conductors 50.

In the embodiment of FIGS. 1A, 1B, and 1C and the embodiment of FIGS. 2A and 2B, the electrical conductors 50, the light-interactive electrical components 62, and the optical elements 70 are all located on the first side 12 of the flexible substrate 10. Referring next to FIGS. 3A and 3B, in another embodiment of the present invention, the folded micro-wire substrate structure 5 includes the flexible substrate 10 having the first side 12 and the second side 14 opposed to the first side 12 in the direction 40 perpendicular to the first side 12. The flexible substrate 10 has the first portion 21 and the second portion 22 adjacent to the first portion 21 of the flexible substrate 10 in the substrate direction 42 when the flexible substrate 10 is in a flat, unfolded configuration (FIG. 3B). The flexible substrate 10 has at least the first fold 31 between the first and second portions 21, 22 so that the first portion 21 is aligned and adjacent to the second portion 22 in the perpendicular direction 40 (FIG. 3A). One or more electrical conductors 50 are located in or on the flexible substrate 10. At least one electrical component 60 or light-interactive electrical component 62 is located on or in the flexible substrate 10 in the first portion 21. At least one optical element 70 is located on or in the flexible substrate 10 in the second portion 22 on a side of the flexible substrate 10 opposite a side of the flexible substrate 10 than has the electrical component 60 or light-interactive electrical component 62 located thereon so that the optical element 70 directs light 44 to or from the electrical component 60 or the light-interactive electrical component 62. In an embodiment the extended portion 26 of the flexible substrate 10 adjacent to the first portion 21 extends beyond second portion 22 in the substrate direction 42 in the folded configuration.

Figure 4A:
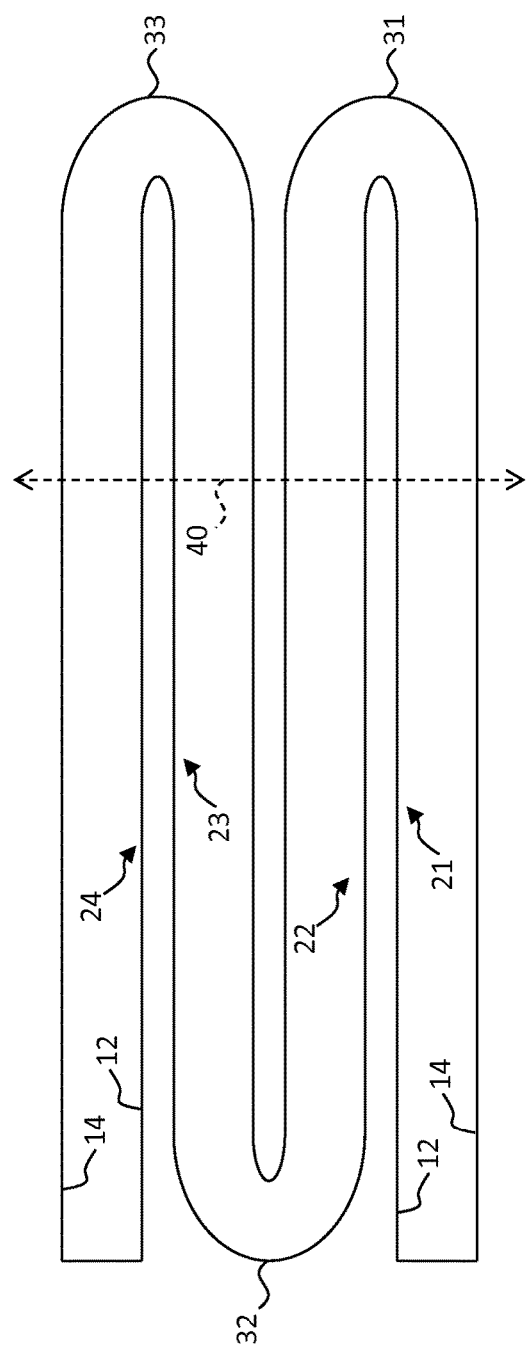
FIG. 4A is a cross section of an embodiment of the present invention in a folded configuration.
Figure 4B:
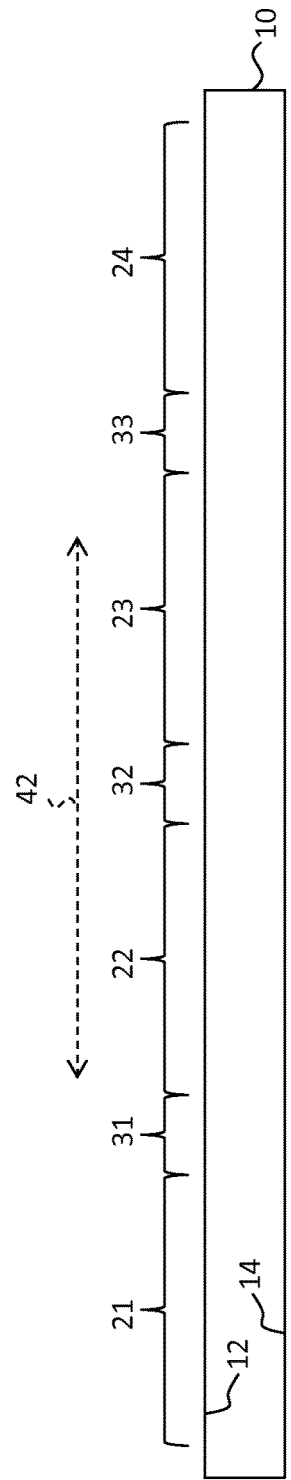
FIG. 4B is a cross section of an embodiment of the present invention corresponding to FIG. 4A in a flat, unfolded configuration.

Turning next to FIGS. 4A and 4B, the folded micro-wire substrate structure 5 includes the flexible substrate 10 having the first side 12 and the second side 14 opposed to the first side 12 in the direction 40 perpendicular to the first side 12. The flexible substrate 10 has the first portion 21 and the second portion 22 adjacent to the first portion 21 of the flexible substrate 10 in the substrate direction 42 when the flexible substrate 10 is in a flat, unfolded configuration (FIG. 4B). The flexible substrate 10 has at least the first fold 31 between the first and second portions 21, 22 so that the first portion 21 is aligned and adjacent to the second portion 22 in the perpendicular direction 40 (FIG. 4A). The flexible substrate 10 further includes a fourth portion 24 adjacent to the third portion 23 so that the third portion 23 is between the second and fourth portions 22, 24 of the flexible substrate 10, both on the first side 12 along the surface of the flexible substrate 10 in the substrate direction 42 and in the perpendicular direction 40. The flexible substrate 10 has a third fold 33 between the third and fourth portions 23, 24 so that the fourth portion 24 is adjacent to the third portion 23 in the perpendicular direction 40.

Similarly, referring to FIGS. 5A and 5B, the folded micro-wire substrate structure 5 includes the flexible substrate 10 having the first side 12 and the second side 14 opposed to the first side 12 in the direction 40 perpendicular to the first side 12. The flexible substrate 10 has the first portion 21 and the second portion 22 adjacent to the first portion 21 of the flexible substrate 10 in the substrate direction 42 when the flexible substrate 10 is in a flat, unfolded configuration (FIG. 4B). The flexible substrate 10 has at least the first fold 31 between the first and second portions 21, 22 so that the first portion 21 is aligned and adjacent to the second portion 22 in the perpendicular direction 40 (FIG. 4A). The flexible substrate 10 includes the fourth portion 24 adjacent to the third portion 23 so that the third portion 23 is between the second and fourth portions 22, 24 of the flexible substrate 10, both on the first side 12 along the surface of the flexible substrate 10 in the substrate direction 42 and in the perpendicular direction 40. The flexible substrate 10 has the third fold 33 between the third and fourth portions 23, 24 so that the fourth portion 24 is adjacent to the third portion 23 in the perpendicular direction 40. The flexible substrate 10 further includes a fifth portion 25 adjacent to the fourth portion 24 so that the fourth portion 24 is between the third and fifth portions 23, 25 of the flexible substrate 10, both on the first side 12 along the surface of the flexible substrate 10 in the substrate direction 42 and in the perpendicular direction 40. The flexible substrate 10 has a fourth fold 34 between the fourth and fifth portions 24, 25 so that the fifth portion 25 is adjacent to the fourth portion 24 in the perpendicular direction 40.

Referring next to FIGS. 6 and 7, the optical element 70 is a first optical element 70 on or in the first side 12 and the flexible substrate 10 further includes at least one second optical element 72 on or in the second side 14. In one embodiment, as shown in FIG. 6, the first and second optical elements 70, 72 have a common optical axis 74. In another embodiment, as shown in FIG. 7, the first and second optical elements 70, 72 do not have a common optical axis 74. As noted with respect to FIG. 1A, the first and second optical elements 70, 72 are effective to direct light to the light-sensitive electrical components (not shown in FIGS. 6 and 7).

Referring next to FIGS. 8 and 9, in an embodiment of the present invention, the folded micro-wire substrate structure 5 further includes an additional substrate 16 located between the first and second portions 21, 22 or between the second and third portions 22, 23 of the flexible substrate 10 in the perpendicular direction 40. In one embodiment, the additional substrate 16 is electrically insulating. In another embodiment, the additional substrate 16 is transparent. Referring specifically to FIG. 9 in yet another embodiment, the additional substrate 16 has one or more optical elements 70 formed in or secured to the additional substrate 16. The optical elements 70 are located on one side of the additional substrate 16 or on both sides, as shown in FIG. 9.

Figure 10:
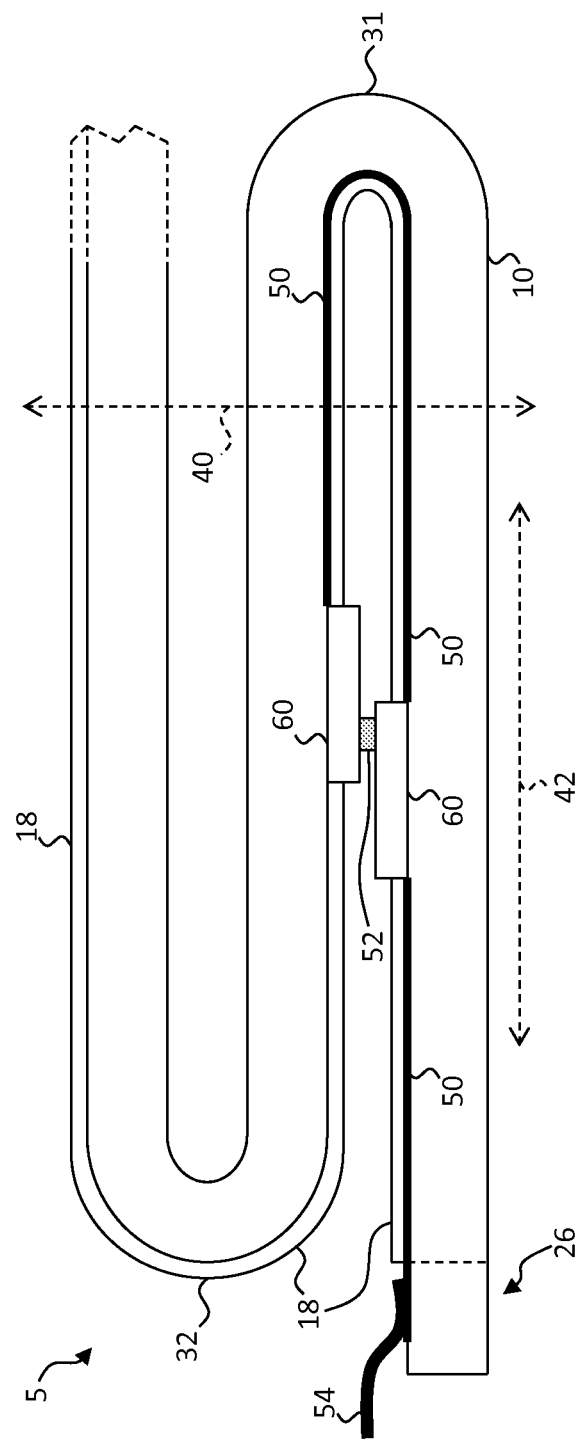

In a further embodiment of the present invention illustrated in FIG. 10, the folded micro-wire substrate structure 5 further includes a protective layer 18 on the flexible substrate 10 so that at least one electrical conductor 50 is between the protective layer 18 and at least a portion of the flexible substrate 10. The protective layer 18 can include a polymer or layers of polymers and, in an embodiment is cured and includes, for example cross linking materials. In a useful embodiment, the protective layer 18 is transparent.

The protective layer 18 can protect the flexible substrate 10, the electrical conductors 50, or the electrical components 60 from environmental damage. In an embodiment, the protective layer 18 relieves stress or strain on the electrical conductors 50 when the flexible substrate 10 and portions of the electrical conductors 50, for example in the first or second folds 31 or 32 are in a folded configuration. In an embodiment, the electrical conductors 50 have a thickness less than one half the thickness of the flexible substrate 10. In another embodiment, the protective layer 18 has a thickness equal to, or greater than, the flexible substrate (not shown).

As shown in FIGS. 2A, 2B, 3A, 3B, and 10, in an embodiment the flexible substrate 10 further includes the extended portion 26 adjacent to the first portion 21 so that the first portion 21 is located between the extended portion 26 and the second portion 22 in the substrate direction 42 and so that there is no portion of the flexible substrate 10 adjacent to the extended portion 26 in the perpendicular direction 40. The extended portion 26 is useful for connecting an external device, such as an electronic controller or other electrical component, to the electrical conductors 50, for example with a wire 54 or ribbon cable including a plurality of wires 54, each connected to a different electrical conductor 50. The electrical conductor 50 can form a connection pad to which the wire 54 is affixed. Wires 54, ribbon cables, and electronic controllers are known in the art.

In a further embodiment of the present invention, as shown in FIG. 10, the folded micro-wire substrate structure 5 further includes an electrical connector 52 between an electrical conductor 50 or electrical component 60 in the first portion 21 and an electrical conductor 50 or electrical component 60 in the second portion 22 that does not extend across the first fold 31. Such an electrical connector 52 can directly connect electrical conductors 50 or electrical components 60 from one portion of the flexible substrate 10 to another portion and provide connectivity to the electrical circuit formed by the electrical conductors 50 and electrical components 60.

In yet another embodiment, at least a part of the first portion 21 is in contact with at least a part of the second portion 22, or at least a part of the second portion 22 is in contact with at least a part of the third portion 23. Contacting the portions can aid in manufacturing alignment, forming electrical connections between electrical conductors 50 in different portions, or in light transmission. Such a contact can also seal the various components to prevent exposure to the ambient environment. In an embodiment, a patterned insulating adhesive or UV-curable layer is put between at least part of the portions to assist in adhesion and contacting only those desired parts of the portions. In one embodiment, the additional substrate 16 (FIG. 8) is patterned so that at least some parts of the first, second, or third portions 21, 22, 23 are in contact.

The present invention provides a structure and method for making a high-density electronic or optoelectronic circuit on a single flexible substrate 10. The structure can form a three-dimensional circuit and is useful for a variety of applications, including photo-voltaic systems for generating electrical power from electromagnetic energy (e.g. solar power) or for light-emitting systems such as displays. Because the high-density electronic or optoelectronic circuit is formed on a single flexible substrate 10, manufacturing process costs are reduced, parts count is reduced, and alignment simplified. Moreover, in an embodiment the folded micro-wire substrate structure 5 is manufactured in a flat configuration and then folded when in operation. Furthermore, in an embodiment, the folded micro-wire substrate structure 5 is unfolded into a flat configuration after operation in a folded configuration. In other useful processes, the micro-wire substrate structure is transported in a flat configuration.

Referring to FIG. 11, a method of making the folded micro-wire substrate structure 5 includes providing the flexible substrate 10 having the first side 12 and the second side 14 opposed to the first side 12 in the direction 40 perpendicular to the first side 12 in step 100. The flexible substrate 10 has the first portion 21, the second portion 22 adjacent to the first portion 21, and the third portion 23 adjacent to the second portion 22 so that the second portion 22 is located between the first and third portions 21, 23 of the flexible substrate 10 in the substrate direction 42.

In optional step 110, a surface (e.g. first side 12) of the flexible substrate 10 is structured to form micro-channels and one or more optical elements 70. In an embodiment, the formation of the micro-channels and the optical elements 70 is done at least partly in a single processing step with common materials. One or more electrical conductors 50 are formed on or in the flexible substrate 10 in step 110, for example in the micro-channels or printed on the first side 12. In optional step 120, the electrical components 60 are located on the flexible substrate 10 in electrical communication with the electrical conductors 50. In another optional step 130, the protective layer 18 is coated on the flexible substrate 10. The protective layer 18 can cover the electrical conductors 50 or the electrical components 60. An external electrical connection, for example a ribbon cable including wires 54 is electrically connected to one or more of the electrical conductors 50 in step 140. In optional step 150, the flexible substrate 10 is inspected for flaws. In various embodiments, one or more inspection steps 150 are performed after the various different steps of the method.

The flexible substrate 10 is folded in step 160 with the first fold 31 between the first and second portions 21, 22 so that the first portion 21 is located adjacent to the second portion 22 in the perpendicular direction 40 and with at least the second fold 32 between the second and third portions 22, 23 so that the second side 14 is between the second portion 22 and the third portion 23 in the perpendicular direction 40. In step 170, the folded flexible substrate 10 is secured to form the folded micro-wire substrate structure 5. In one embodiment, when in a folded configuration the different portions are secured to each other with adhesives. In another embodiment, a mechanical structure is provided.

In another embodiment of the present invention, a method of making the folded micro-wire substrate structure 5 includes providing the flexible substrate 10 having the first side 12 and the second side 14 opposed to the first side 12 in the direction 40 perpendicular to the first side 12 in step 100. The flexible substrate 10 has the first portion 21, the second portion 22 adjacent to the first portion 21, and the third portion 23 adjacent to the second portion 22 so that the second portion 22 is located between the first and third portions 21, 23 of the flexible substrate 10 in the substrate direction 42. The first portion 21 is separated from the second portion 22 by the first fold gap 31 and the second portion 22 is separated from the third portion 23 by the second fold gap 32. One or more optical elements 70 are formed on or in the flexible substrate 10 in the third portion 23 in step 110 or one or more electrical conductors 50 are formed in step 110 on or in the flexible substrate 10 in the first or second portions 21, 22 extending from the first portion 21 into the second portion 22 across the first fold gap 31. In a further embodiment, a method of the present invention further includes forming one or more electrical components 60 on the flexible substrate 10 electrically connected to the one or more electrical conductors 50 in the first or second portions 21, 22 in step 120.

In yet another embodiment, a method of making the folded micro-wire substrate structure 5 includes providing a transparent flexible substrate 10 having the first side 12 and the second side 14 opposed to the first side 12 in the direction 40 perpendicular to the first side 12 in step 100. The flexible substrate 10 has the first portion 21 and the second portion 22 adjacent to the first portion 21 of the flexible substrate 10. One or more optical elements 70 are formed in step 110 on or in the flexible substrate 10 in the second portion 22, one or more electrical conductors 50 are formed in step 110 on or in the flexible substrate 10, and one or more electrical components 60 are formed in step 120 on or in the flexible substrate 10. The flexible substrate 10 is folded in step 160 with the first fold 31 between the first and second portions 21, 22 so that the first portion 21 is aligned with the second portion 22 in the perpendicular direction 40 and the optical element 70 directs light 44 to or from the electrical component 60.

In a further embodiment, a method of making the folded micro-wire substrate structure 5 includes providing the transparent flexible substrate 10 having the first side 12 and the second side 14 opposed to the first side 12 in the direction 40 perpendicular to the first side 12 in step 100. The flexible substrate 10 has the first portion 21 and the second portion 22 adjacent to the first portion 21 of the flexible substrate 10 and is separated from the first portion 21 by the first fold gap 31. One or more optical elements 70 is formed on or in the flexible substrate 10 in the second portion 22 and one or more electrical conductors 50 is formed on or in the flexible substrate 10 in the first portion 21.

In embodiments, the flexible substrate 10 is any substrate that is bent or folded at least once and that has a surface on which the electrical conductors 50, electrical components 60, or optical elements 70 are formed. In an embodiment, the flexible substrate 10 is a plastic or polymer material, is transparent, and has opposing substantially parallel and extensive surfaces (e.g. first side 12 and second side 14), or additional layers. In various embodiments, the flexible substrate 10 is transparent, for example transmitting 50%, 80%, 90%, 95% or more of visible light. The flexible substrates 10 can include a dielectric material and can have a wide variety of thicknesses, for example 10 microns, 50 microns, 100 microns, 1 mm, or more.

In an embodiment, the electrical conductors 50 are micro-wires in micro-channels in the flexible substrate 10 or the electrical components 60 are printed on the flexible substrate 10, for example by gravure printing, offset printing, flexographic printing, or inkjet printing. In a useful method, a patterned stamp or printing plate is provided and coated with a conductive ink, and the conductive ink is printed on the first side 12, the second side 14, or both the first and second sides 12, 14 of the flexible substrate 10. In another embodiment, the conductive ink is printed with an inkjet printer. Alternatively, the electrical conductors 50 or electrical components 60 are affixed to the flexible substrate 10. For example, pick-and-place technologies for affixing integrated circuits to a substrate are well known. In one embodiment, the electrical components 60 are located on the flexible substrate 10 or formed on the flexible substrate 10 after the electrical conductors 50 are located on the flexible substrate 10 or formed on the flexible substrate 10. Alternatively, the electrical components 60 are located on the flexible substrate 10 or formed on the flexible substrate 10 before the electrical conductors 50 are located on the flexible substrate 10 or formed on the flexible substrate 10. The electrical components 60 can include pads or leads that are soldered or otherwise electrically connected to the electrical conductors 50 using methods known in the art, for example with anisotropic conductive films.

In various embodiments, the electrical components 60 are integrated circuits using inorganic materials that are placed and affixed to the flexible substrate 10. In other embodiments, the electrical components 60 are formed on the flexible substrate 10, for example using organic materials known in the art such as pentacene or using inorganic materials. Methods including coating, curing, and patterning materials are usable and known in the art, for example using photolithographic techniques or atomic layer deposition and selective area deposition methods.

Referring next to FIG. 12, in a useful embodiment, the flexible substrate 10 includes a layer on a side of a support and a method of the present invention further includes coating a curable layer on the side of the support in step 111. The curable layer can be a polymer or resin layer that includes cross linking elements activated by heat or radiation to form a cured layer. The coated curable layer is imprinted in step 112, for example with a stamp, to form micro-channels for the electrical conductors 50 or to form optical elements 70. The curable layer is cured in step 113 to form a cured layer having the micro-channels or optical elements 70, for example using heat or radiation. The cured layer forms the layer on the side of the support and a surface of the cured layer is opposite the support forming the first side 12. Steps 111 through 113 effectively structure the surface of the flexible substrate 10 in step 110.

Imprinted structures are also known to those skilled in the art as embossed or impressed structures formed by locating in a curable layer an imprinting, impressing, or embossing stamp having protruding structural features, curing the layer, and then removing the stamp to form micro-channels or optical elements 70 corresponding to the structural features.

In various embodiments, curable layers are deposited as a single layer in a single step using coating methods known in the art, e.g. curtain coating. In an alternative embodiment, curable layers are deposited as multiple sub-layers using multi-level deposition methods known in the art, e.g. multi-level slot coating, repeated curtain coatings, or multi-level extrusion coating. In yet another embodiment, curable layers include multiple sub-layers formed in different, separate steps, for example with a multi-level extrusion, curtain coating, or slot coating as is known in the coating arts. Such coating methods are also applicable to forming the protective layer 18.

Cured layers useful in the present invention can include a cured polymer material with cross-linking agents that are sensitive to heat or radiation, for example infra-red, visible light, or ultra-violet radiation. The polymer material can be a curable material applied in a liquid form that hardens when the cross-linking agents are activated, for example with exposure to radiation or heat. Micro-channels and optical elements 70 are embossed and cured in curable layers in a single step using a single stamp that includes structural elements for forming both micro-channels and lens structures. When a molding device, such as a stamp having an inverse micro-channel or optical element 70 structure is applied to liquid curable material in a curable layer coated on the flexible substrate 10 and the cross-linking agents in the curable material are activated, the liquid curable material in the curable layer is hardened into a cured layer having micro-channels or optical element 70 or both with the inverse structure of the stamp. Thus, in an embodiment, a method of the present invention includes imprinting one or more optical elements 70 in the curable layer in a common step with imprinting the micro-channels. The liquid curable materials can include a surfactant to assist in controlling coating. Materials, tools, and methods are known for embossing coated liquid curable materials to form cured layers having conventional single-layer micro-channels.

Referring next to step 114 of FIG. 12, a method of the present invention further includes coating the cured layer and micro-channels with a conductive ink. Excess conductive ink is removed from the surface of the cured layer in step 115 and the conductive ink in the micro-channels is cured in step 116, for example using heat, HCl vapor, or radiation, to form micro-wires in the micro-channels that are the electrical conductors 50.

Curable inks useful in the present invention are known and can include conductive inks having electrically conductive nano-particles, such as silver nano-particles. The electrically conductive nano-particles can be metallic or have an electrically conductive shell. In various embodiments, the electrically conductive nano-particles are silver, are a silver alloy, include silver, are copper, are a copper alloy, or include copper. In other embodiments, cured inks can include metal particles, for example nano-particles. The metal particles can be sintered to form a metallic electrical conductor. The metal nano-particles can be silver or a silver alloy or other metals, such as tin, tantalum, titanium, gold, copper, or aluminum, or alloys thereof. Cured inks can include light-absorbing materials such as carbon black, a dye, or a pigment.

Curable inks provided in a liquid form are deposited or located in micro-channels and cured, for example by heating or exposure to radiation such as infra-red, visible light, or ultra-violet radiation. The curable ink hardens to form the cured ink that makes up micro-wires useful as electrical conductors 50. For example, a curable conductive ink with conductive nano-particles is located within micro-channels and heated to agglomerate or sinter the nano-particles, thereby forming an electrically conductive micro-wire. Materials, tools, and methods are known for coating liquid curable inks to form the micro-wires in conventional single-layer micro-channels. The curable conductive ink is not necessarily electrically conductive before it is cured.

Electrically conductive micro-wires and methods of the present invention are useful for making electrical conductors 50, for example as used in electrodes and electrical buses. A variety of micro-wire or micro-channel patterns can be used and the present invention is not limited to any one pattern. The micro-wires can be spaced apart, form separate electrical conductors 50, or intersect to form a mesh electrical conductor on or in a layer. Micro-channels can be identical or have different sizes, aspect ratios, or shapes. Similarly, the micro-wires can be identical or have different sizes, aspect ratios, or shapes. Micro-wires can be straight or curved.

In some embodiments, a micro-channel is a groove, trench, or channel formed in a cured layer and having a cross-sectional width less than 20 microns, for example 10 microns, 5 microns, 4 microns, 3 microns, 2 microns, 1 micron, or 0.5 microns, or less. In an embodiment, a micro-channel depth is comparable to a micro-channel width. Micro-channels can have a rectangular cross section. Other cross-sectional shapes, for example trapezoids, are known and are included in the present invention. The width or depth of a layer is measured in cross section.

In an embodiment, a curable ink can include conductive nano-particles in a liquid carrier (for example an aqueous solution including surfactants that reduce flocculation of metal particles, humectants, thickeners, adhesives or other active chemicals). The liquid carrier can be located in micro-channels and heated or dried to remove liquid carrier or treated with hydrochloric acid, leaving a porous assemblage of conductive particles that can be agglomerated or sintered to form a porous electrical conductor in a layer. Thus, in an embodiment, curable inks are processed to change their material compositions, for example conductive particles in a liquid carrier are not electrically conductive but after processing form an assemblage that is electrically conductive.

Once deposited, the conductive inks are cured, for example by heating. The curing process drives out the liquid carrier and sinters the metal particles to form a metallic electrical conductor. Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in the micro-wire formation process.

In an example and non-limiting embodiment of the present invention, each micro-wire is from 10 to 15 microns wide, from 5 to 10 microns wide, from one micron to five microns wide or from one/half micron to one micron wide. In some embodiments, micro-wires can fill micro-channels; in other embodiments micro-wires do not fill micro-channels. In an embodiment, micro-wires are solid; in another embodiment micro-wires are porous.

Micro-wires can include metal, for example silver, gold, aluminum, nickel, tungsten, titanium, tin, or copper or various metal alloys including, for example silver, gold, aluminum, nickel, tungsten, titanium, tin, or copper. Micro-wires can include a thin metal layer composed of highly conductive metals such as gold, silver, copper, or aluminum. Other conductive metals or materials can be used. Alternatively, micro-wires can include cured or sintered metal particles such as nickel, tungsten, silver, gold, titanium, or tin or alloys such as nickel, tungsten, silver, gold, titanium, or tin. Conductive inks can be used to form micro-wires with pattern-wise deposition or pattern-wise formation followed by curing steps. Other materials or methods for forming micro-wires, such as curable ink powders including metallic nano-particles, can be employed and are included in the present invention.

Electrically conductive micro-wires of the present invention can be operated by electrically connecting the micro-wires through connection pads to electrical circuits that provide or receive electrical current to or from the micro-wires and can control the electrical behavior of the micro-wires. In operation, electrically interconnected electrical conductors 50 and electrical components 60 of the present invention are electrically controlled by a controller. Electrical signals are provided to or received from any electrical components 60 to process information, control sensors, respond to sensors, emit electromagnetic radiation, or respond to electromagnetic radiation. Integrated circuits and electrical circuits are generally well known in the computing arts and can include circuits built on crystalline inorganic materials such as silicon or using organic materials that are formed on or in or affixed to the flexible substrate 10.

Methods and devices for forming and providing flexible substrates 10 and coating flexible substrates 10 are known in the photo-lithographic arts. Likewise, tools for laying out electrodes, conductive traces, connectors, and electrical components are known in the electronics industry as are methods for manufacturing such electronic system elements. All of these tools and methods can be usefully employed to design, implement, construct, and operate the present invention.

The present invention contemplates integrating optical elements 70 with electrical components 60 and electrical conductors 50. Hence, in an embodiment, a useful method of the present invention includes locating an electrical component 60 on or in the flexible substrate 10 in the first, second, or third portion 21, 22, 23 and folding the flexible substrate 10 so that the optical element 70 directs light to or from the electrical components 60 or the light-interactive electrical components 62.

In one embodiment of the present invention, the optical elements 70, the electrical components 60, and the electrical conductors 50 are all formed on a common side of the flexible substrate 10, for example first side 12. As illustrated in FIGS. 3A, 3B, 6, and 7, one or more of the optical elements 70, electrical components 60, and electrical conductors 50 are formed on different sides, for example on first side 12 and second side 14. The imprinting method described above is applicable to such arrangements. For example, the flexible substrate 10 can include a support having opposing first and second support sides and a curable layer coated on both the first and second support sides. One or more micro-channels are formed in a curable layer on the second support side and an electrical conductor formed in each micro-channel. A surface of the layer on the first support side forms the first side 12 and a surface of the layer on the second support side forms the second side 14. Moreover, a useful method can include forming one or more optical elements 70 in the layer on the second support side in a common step with forming the micro-channels on the second support side. The structures on the first and second support sides are formed in different steps, or alternatively the optical elements 70 and micro-channels in the curable layer on each of the first and second support sides are formed in a common step with common materials by imprinting the curable layers on both of the first and second support sides at the same time.

In further steps of the present invention, an additional substrate 16 is located between the first and second portions 21, 22 in the perpendicular direction 40 or is located between the second and third portions 22, 23 in the perpendicular direction 40. The folding steps and location of the additional substrate 16 is performed using mechanical methods known in the art for manipulating substrates. The folding steps can include folding the flexible substrate 10 so that the flexible substrate 10 includes the extended portion 26 adjacent to the first portion 21 with the first portion 21 located between the extended portion 26 and the second portion 22 in the substrate direction 42. The folding steps can also include folding the flexible substrate 10 so that the first, second, and third portion 21, 22, 23 are aligned and the optical elements 70 and electrical components 60 are aligned. A wire 54 is electrically connected to one or more of the electrical conductors using interconnection methods known in the art.

Figure 15:
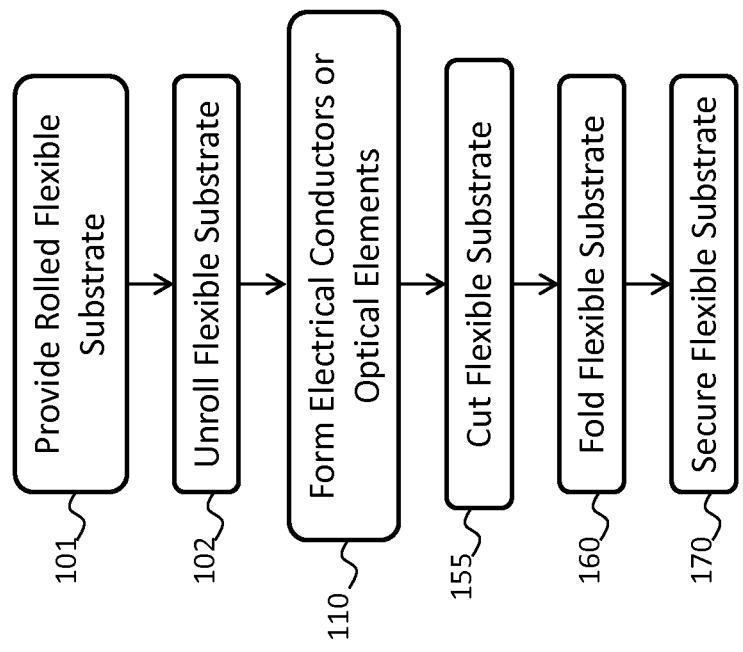
FIG. 15 is a flow diagram illustrating a method of the present invention.

Referring to FIGS. 13, 14, and 15, and also to FIG. 1A, a method of making a folded micro-wire substrate structure 5 includes providing a flexible substrate 10 in a flexible substrate roll 80 configuration in step 101. The flexible substrate 10 has the first side 12 and the second side 14 opposed to the first side 12 in the direction 40 perpendicular to the first side 12, the flexible substrate 10 has the first portion 21, the second portion 22 adjacent to the first portion 21, and the third portion 23 adjacent to the second portion 22 so that the second portion 22 is located between the first and third portions 21, 23 of the flexible substrate 10 (FIG. 1A).

In step 102, the flexible substrate roll 80 is unrolled, and in step 110 a plurality of electrical conductors 50 is formed on or in the flexible substrate 10 for example using a material deposition and processor 82 to form the structures described above in the flexible substrate 10 in step 110. Optional steps 120, 130, and 150 can also be performed. In one embodiment of the present invention, the flexible substrate 10 is then rolled and transported or stored (FIG. 13). In another embodiment, the flexible substrate 10 is not rolled. If the flexible substrate 10 is rolled, it is then unrolled in repeated step 102. In either case, the first, second, and third portions 21, 22, 23 are cut with a knife 84 from the unrolled flexible substrate 10 to form a cut portion 28 of the flexible substrate 10 in step 155. The cut portion 28 of the flexible substrate 10 is folded in step 160 with the first fold 31 between the first and second portions 21, 22 so that the first portion 21 is located adjacent to the second portion 22 in the perpendicular direction 40 and with at least the second fold 32 between the second and third portions 22, 23 so that the second side 14 is between the second portion 22 and the third portion 23 in the perpendicular direction 40 (FIG. 1A) in step 160 to form a folded flexible substrate 86. The folded flexible substrate 86 is secured in step 170 to form a secured folded micro-wire substrate structure 88 forming the folded micro-wire substrate structure 5.

In another embodiment of the present invention, referring again to FIGS. 13, 14, and 15, and also to FIG. 2A, a method of making a folded micro-wire substrate structure 5 includes providing in step 101 a flexible substrate 10 in a flexible substrate roll 80 configuration. The flexible substrate 10 has the first side 12 and the second side 14 opposed to the first side 12 in the direction 40 perpendicular to the first side 12. The flexible substrate 10 has the first portion 21 and the second portion 22 adjacent to the first portion 21 of the flexible substrate 10 (FIG. 2A).

In step 102, the flexible substrate roll 80 is unrolled, and in step 110 a plurality of electrical conductors 50 is formed on or in the flexible substrate 10 for example using a material deposition and processor 82 to form the structures described above in the flexible substrate 10 in step 110. In one embodiment of the present invention, the flexible substrate 10 is then rolled and transported or stored (FIG. 13). In another embodiment, the flexible substrate 10 is not rolled. If the flexible substrate 10 is rolled, it is then unrolled in repeated step 102. In either case, the first and second portions 21, 22 are cut with the knife 84 from the unrolled flexible substrate 10 to form the cut portion 28 of the flexible substrate 10 in step 155. The cut portion 28 of the flexible substrate 10 is then folded in step 160 with a first fold 31 between the first and second portions 21, 22 so that the first portion 21 is located adjacent to the second portion 22 in the perpendicular direction 40 (FIG. 2A) in step 160 to form a folded flexible substrate 86 (with two portions 21, 22 rather than the three portions 21, 22, 23 depicted in FIG. 14). The folded flexible substrate 86 is secured in step 170 to form the secured folded micro-wire substrate structure 88 forming the folded micro-wire substrate structure 5.

The invention has been described in detail with particular reference to certain embodiments thereof, but it will be understood that variations and modifications can be effected within the spirit and scope of the invention.

PARTS LIST

A cross section line
5 folded micro-wire substrate structure
10 flexible substrate
12 first side
14 second side
16 additional substrate
18 protective layer
21 first portion
22 second portion
23 third portion
24 fourth portion
25 fifth portion
26 extended portion
28 cut portion
31 first fold/first fold gap
32 second fold/second fold gap
33 third fold
34 fourth fold
40 perpendicular direction
42 substrate direction
44 light
50 electrical conductor
52 electrical connector
54 wire
60 electrical component
62 light-interactive electrical component
70 optical element/first optical element
72 second optical element
74 optical axis Parts List Cont'D 80 flexible substrate roll
82 material deposition and processor
84 knife
86 folded flexible substrate
88 secured folded flexible substrate
100 provide flexible substrate step
101 provide rolled flexible substrate step
102 unroll flexible substrate step
110 form electrical conductors step
111 coat curable layer on flexible substrate step
112 imprint curable layer step
113 cure curable layer step
114 coat imprinted cured layer with conductive ink step
115 remove excess conductive ink step
116 cure conductive ink in micro-channels step
120 locate electrical components step
130 coat protective layer step
140 affix connector step
150 inspect flexible substrate step
155 cut flexible substrate step
160 fold flexible substrate step
170 secure folded substrate step

The invention claimed is:

1. A method of making a folded micro-wire substrate structure, comprising:
   providing a flexible substrate having a first side and a second side opposed to the first side, the flexible substrate having a first portion, a second portion adjacent to the first portion, and a third portion adjacent to the second portion so that the second portion is located between the first and third portions of the flexible substrate;
   forming one or more electrical conductors on or in the flexible substrate;
   folding the flexible substrate with a first fold between the first and second portions so that the first portion is located adjacent to the second portion in a direction perpendicular to the first, second, and third portions of the flexible substrate;
   folding the flexible substrate having at least a second fold between the second and third portions so that the second side is between the second portion and the third portion in the perpendicular direction;
   securing the folded flexible substrate to form the folded micro-wire substrate structure; and
   wherein the flexible substrate includes a layer on a side of a support and further including coating a curable layer on the side of the support, imprinting the curable layer to form micro-channels in the curable layer, and curing the curable layer to form a cured layer having micro-channels and a surface, the cured layer forming the layer on the side of the support and a surface of the cured layer opposite the support forming the first side.

2. The method of claim 1 further including forming an electrical connection between an electrical conductor in the first portion and an electrical conductor in the second portion that does not extend across the first fold.

3. The method of claim 1 further including coating the cured layer and micro-channels with a conductive ink, removing the conductive ink from the surface of the cured layer, and curing the conductive ink in the micro-channels to form micro-wires in the micro-channels that are the electrical conductors.

4. The method of claim 1 further including imprinting one or more optical elements in the curable layer in a common step with imprinting the micro-channels.

5. The method of claim 4 further including locating an electrical component on or in the flexible substrate in the first, second, or third portion and folding the flexible substrate so that the optical element directs light to or from the electrical component.

6. The method of claim 1 wherein the side of the support is a first support side and a side of the cured layer opposite the first support side is a second support side and further including forming one or more micro-channels in a layer on the second support side and forming an electrical conductor in each micro-channel, so that a surface of the layer on the first support side forms the first side and a surface of the layer on the second support forms the second side.

7. The method of claim 6 further including forming one or more optical elements in the layer on the second support side in a common step with forming the micro-channels.

8. The method of claim 1 further including folding the flexible substrate so that the flexible substrate includes an extended portion adjacent to the first portion with the first portion located between the extended portion and the second portion and further including electrically connecting a wire to one or more of the electrical conductors.

9. The method of claim 1 further including forming an electrical component on the flexible substrate.

10. The method of claim 1 further including printing an electrical component on the flexible substrate.

11. The method of claim 1 further including locating an electrical component on the flexible substrate wherein the electrical component has a substrate distinct from the flexible substrate.

12. The method of claim 1 further including inspecting the flexible substrate and electrical conductors before folding the flexible substrate.

13. The method of claim 1 further including locating an additional substrate between the first and second portions in the perpendicular direction.

14. The method of claim 1 wherein at least one electrical conductor extends from the first portion to the second portion and across the first fold, or from the second portion to the third portion and across the second fold, or from the first portion to the third portions and across the first and second folds.

15. The method of claim 1 further including forming a protective layer on the flexible substrate so that the electrical conductors are between the protective layer and at least a portion of the flexible substrate.

16. A method of making a folded micro-wire substrate structure, comprising:
   providing a flexible substrate having a first side and a second side opposed to the first side, the flexible substrate having a first portion, a second portion adjacent to the first portion, and a third portion adjacent to the second portion so that the second portion is located between the first and third portions of the flexible substrate;
   printing conductive ink on the flexible substrate and curing the conductive ink to form one or more electrical conductors;
   folding the flexible substrate with a first fold between the first and second portions so that the first portion is located adjacent to the second portion in a direction perpendicular to the first, second, and third portions of the flexible substrate;
   folding the flexible substrate having at least a second fold between the second and third portions so that the second side is between the second portion and the third portion in the perpendicular direction; and
   securing the folded flexible substrate to form the folded micro-wire substrate structure.

* * * * *